US010269925B2

(12) United States Patent
Zhang et al.

(10) Patent No.: US 10,269,925 B2
(45) Date of Patent: Apr. 23, 2019

(54) MANUFACTURE METHOD OF LOW TEMPERATURE POLY-SILICON TFT SUBSTRATE AND LOW TEMPERATURE POLY-SILICON TFT SUBSTRATE

(71) Applicant: Wuhan China Star Optoelectronics Technology Co., Ltd., Wuhan (CN)

(72) Inventors: Zhandong Zhang, Wuhan (CN); Fuhsiung Tang, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 307 days.

(21) Appl. No.: 15/031,753

(22) PCT Filed: Feb. 25, 2016

(86) PCT No.: PCT/CN2016/074500
§ 371 (c)(1),
(2) Date: Apr. 25, 2016

(87) PCT Pub. No.: WO2017/124603
PCT Pub. Date: Jul. 27, 2017

(65) Prior Publication Data
US 2018/0053834 A1    Feb. 22, 2018

(30) Foreign Application Priority Data
Jan. 21, 2016    (CN) .......................... 2016 1 0040572

(51) Int. Cl.
*H01L 29/66*    (2006.01)
*H01L 21/265*    (2006.01)
(Continued)

(52) U.S. Cl.
CPC .. *H01L 29/66492* (2013.01); *H01L 21/26506* (2013.01); *H01L 21/77* (2013.01);
(Continued)

(58) Field of Classification Search
CPC ............. H01L 27/3265; H01L 27/3262; H01L 27/1281; H01L 27/14665; H01L 29/78672; H01L 29/66492
See application file for complete search history.

(56) References Cited

U.S. PATENT DOCUMENTS

2009/0272978 A1*  11/2009  Liu ..................... H01L 27/1229
                                                          257/71
2010/0065851 A1*  3/2010  Makita ................... H01L 27/12
                                                          257/72
2017/0018729 A1*  1/2017  Jiao ......................... H01L 51/56

FOREIGN PATENT DOCUMENTS

CN            101170076 A        4/2008

* cited by examiner

*Primary Examiner* — Changhyun Yi
(74) *Attorney, Agent, or Firm* — Leong C. Lei

(57) ABSTRACT

The present invention provides a manufacture method of a Low Temperature Poly-silicon TFT substrate and a Low Temperature Poly-silicon TFT substrate, in which by locating one heat sink layer under the amorphous silicon layer in advance, the difference of the crystallizations of the polysilicons in the drive area and the display area can exist after implementing an Excimer Laser Annealing process to the amorphous silicon layer, and in the drive area, the polysilicon with the larger lattice dimension is formed to promote the electron mobility; the fractured crystals can be achieved in the crystallization process of the display area to form the polysilicon with the smaller lattice dimension for ensuring the uniformity of the grain boundary and raising the unifor- (Continued)

drive area            display area mity of the current, and thus, the electrical property demands for the different TFTs can be satisfied to raise the light uniformity of the OLED.

4 Claims, 9 Drawing Sheets

(51) Int. Cl.
    *H01L 29/786*     (2006.01)
    *H01L 21/77*     (2017.01)
    *H01L 27/12*     (2006.01)
    *H01L 27/32*     (2006.01)
    *H01L 27/085*     (2006.01)

(52) U.S. Cl.
    CPC ............ *H01L 27/085* (2013.01); *H01L 27/12* (2013.01); *H01L 27/32* (2013.01); *H01L 27/3225* (2013.01); *H01L 29/78618* (2013.01); *H01L 29/78672* (2013.01); *H01L 27/1203* (2013.01)

MANUFACTURE METHOD OF LOW TEMPERATURE POLY-SILICON TFT SUBSTRATE AND LOW TEMPERATURE POLY-SILICON TFT SUBSTRATE

FIELD OF THE INVENTION

The present invention relates to a display technology field, and more particularly to a manufacture method of a Low Temperature Poly-silicon TFT substrate and a Low Temperature Poly-silicon TFT substrate.

BACKGROUND OF THE INVENTION

The Low Temperature Poly-silicon (LTPS) technology is the manufacture technology of the new generation TFT substrate. The response speed of the LTPS display is faster and possesses advantages of high brightness, high resolution and low electrical power consumption. The Poly-silicon (Poly-Si) possesses excellent electrical property, and the better drive ability to the Active-Matrix Organic Light Emitting Diode (AMOLED). Thus, the AMOLED display back plate based on the Low Temperature Poly-silicon technology has been widely utilized at present.

The Excimer Laser Annealing (ELA) technology is the key skill in the LTPS manufacture process. The skill is to utilize the transient pulses of the laser to irradiate on the surface of the amorphous silicon layer to be melted and recrystallized to form the Low Temperature Poly-silicon.

The AMOLED driving requires a drive TFT and a display TFT. The drive TFT demands larger lattice and thus higher electron mobility is required. The display TFT needs efficient electron mobility and uniformity of the electrical current. Accordingly, the OLED element can uniformly illuminate.

Please refer to FIG. 1 to FIG. 4, which show diagrams of a manufacture method of a Low Temperature Poly-silicon TFT substrate according to prior art. The method comprises:

step 1, providing a substrate 100, and the substrate 100 comprises a drive area and a display area; depositing a buffer layer 200 on the substrate 100, and depositing an amorphous silicon layer 300 on the buffer layer 200;

step 2, implementing an Excimer Laser Annealing process to the amorphous silicon layer 300 to make the amorphous silicon layer 300 to be crystallized and converted to be a polysilicon layer 400 after an Excimer Laser Annealing pretreatment;

step 3, patterning the polysilicon layer 400 to form a first polysilicon section 410 in the driving area, and a second polysilicon section 420 in the display area;

step 4, sequentially forming a gate isolation layer 500, a first gate 510 and a second gate 520 respectively located in the driving area and the display area on the buffer layer 200, the first polysilicon section 410 and the second polysilicon section 420, an interlayer insulation layer 600 located on the gate isolation layer 500, the first gate 510 and the second gate 520, and a first source/the first drain 710 and a second source/the second drain 720 respectively located in the driving area and the display area;

A first via 610 and a second via 620 are respectively formed in the gate isolation layer 400 and the interlayer insulation layer 600 correspondingly above the first polysilicon section 410 and the second polysilicon section 420; the first source/the first drain 710 and the second source/the second drain 720 respectively contact with the first polysilicon section 410 and the second polysilicon section 420 through the first via 610 and the second via 620.

However, the ELA crystallization technology according to prior art cannot achieve effective control to the uniformity of the lattices and the crystallization direction of the lattices. The distribution of crystallization condition in the entire substrate is extremely nonuniform and results in that the display effect is not uniform.

Consequently, there is a need to provide a manufacture method of a Low Temperature Poly-silicon TFT substrate and a Low Temperature Poly-silicon TFT substrate for solving the aforesaid problems.

SUMMARY OF THE INVENTION

An objective of the present invention is to provide a manufacture method of a Low Temperature Poly-silicon TFT substrate, in which the difference of the crystallizations of the polysilicons in the drive area and the display area exists, and in the drive area, the polysilicon with the larger lattice dimension is formed to promote the electron mobility; the fractured crystals can be achieved in the crystallization process of the display area to form the polysilicon with the smaller lattice dimension for ensuring the uniformity of the grain boundary and raising the uniformity of the current, and thus, the electrical property demands for the different TFTs can be satisfied to raise the light uniformity of the OLED.

Another objective of the present invention is to provide a Low Temperature Poly-silicon TFT substrate, in which the difference of the crystallizations of the polysilicons in the drive area and the display area exists, and the lattice dimension the polysilicon in the drive area is larger, and the electron mobility is higher; the fractured crystals can be achieved in the display area, and the lattice dimension the polysilicon is smaller, and the uniformity of the current is better for satisfying the electrical property demands for the different TFTs to raise the light uniformity of the OLED.

For realizing the aforesaid objectives, the present invention provides a manufacture method of a Low Temperature Poly-silicon TFT substrate, comprising steps of:

step 1, providing a substrate, and the substrate comprises a drive area and a display area, and depositing a heat sink layer on the substrate;

step 2, patterning the heat sink layer to remove the heat sink layer in the driving area to form a heat sink section in the display area;

step 3, depositing a buffer layer on the substrate and the heat sink section, and depositing an amorphous silicon layer on the buffer layer;

step 4, implementing an Excimer Laser Annealing process to the amorphous silicon layer to make the amorphous silicon layer to be crystallized and converted to be a polysilicon layer;

step 5, patterning the polysilicon layer to form a first polysilicon section in the driving area, and a second polysilicon section in the display area;

step 6, forming a gate isolation layer on the buffer layer, the first polysilicon section and the second polysilicon section;

step 7, depositing a first metal layer on the gate isolation layer, and patterning the first metal layer to respectively form a first gate and a second gate on the first polysilicon section and the second polysilicon section;

step 8, deposition an interlayer insulation layer on the gate isolation layer, the first gate and the second gate; respectively forming a first via and a second via in the gate isolation layer and the interlayer insulation layer correspondingly above the first polysilicon section and the second polysilicon section;

step 9, depositing a second metal layer on the interlayer insulation layer, and patterning the second metal layer to respectively forming a first source/a first drain in the driving area, and a second source/a second drain in the display area;

the first source/the first drain and the second source/the second drain respectively contact with the first polysilicon section and the second polysilicon section through the first via and the second via.

In the step 5, a lattice dimension of the first polysilicon section is larger than a lattice dimension of the second polysilicon section.

The substrate is a glass substrate; material of the buffer layer, the gate isolation layer and the interlayer insulation layer is Silicon Nitride, Silicon Oxide or a combination of the two; material of the first gate, the second gate, the first source/the first drain and the second source/the second drain is a stack combination of one or more of molybdenum, titanium, aluminum and copper.

Material of the heat sink section is metal.

The present invention further provides a manufacture method of a Low Temperature Poly-silicon TFT substrate, comprising steps of:

step 1, providing a substrate, and the substrate comprises a drive area and a display area, and depositing a buffer layer on the substrate, and depositing a heat sink layer on the buffer layer;

step 2, patterning the heat sink layer to remove the heat sink layer in the driving area to form a heat sink section in the display area;

step 3, depositing an amorphous silicon layer on the buffer layer and the heat sink section;

step 4, implementing an Excimer Laser Annealing process to the amorphous silicon layer to make the amorphous silicon layer to be crystallized and converted to be a polysilicon layer;

step 5, patterning the polysilicon layer to form a first polysilicon section in the driving area, and a second polysilicon section in the display area;

step 6, forming a gate isolation layer on the buffer layer, the first polysilicon section, the second polysilicon section and the heat sink section;

step 7, depositing a first metal layer on the gate isolation layer, and patterning the first metal layer to respectively form a first gate and a second gate on the first polysilicon section and the second polysilicon section;

step 8, deposition an interlayer insulation layer on the gate isolation layer, the first gate and the second gate; respectively forming a first via and a second via in the gate isolation layer and the interlayer insulation layer correspondingly above the first polysilicon section and the second polysilicon section;

step 9, depositing a second metal layer on the interlayer insulation layer, and patterning the second metal layer to respectively forming a first source/a first drain in the driving area, and a second source/a second drain in the display area;

the first source/the first drain and the second source/the second drain respectively contact with the first polysilicon section and the second polysilicon section through the first via and the second via.

In the step 5, a lattice dimension of the first polysilicon section is larger than a lattice dimension of the second polysilicon section.

The substrate is a glass substrate; material of the buffer layer, the gate isolation layer and the interlayer insulation layer is Silicon Nitride, Silicon Oxide or a combination of the two; material of the first gate, the second gate, the first source/the first drain and the second source/the second drain is a stack combination of one or more of molybdenum, titanium, aluminum and copper.

Material of the heat sink section is nonconducting metallic oxide.

The present invention further provides a Low Temperature Poly-silicon TFT substrate structure, comprising a drive area and a display area, and the drive area comprises a substrate, a buffer layer on the substrate, a first polysilicon section on the buffer layer, a gate isolation layer on the buffer layer and the first polysilicon section, a first gate on the gate isolation layer and above the first polysilicon section correspondingly thereto, an interlayer insulation layer on the gate isolation layer and the first gate and a first source/drain on the interlayer insulation layer;

the display area comprises a substrate, a buffer layer on the substrate, a second polysilicon section on the buffer layer, a gate isolation layer on the buffer layer and the second polysilicon section, a second gate on the gate isolation layer and above the second polysilicon section corresponding thereto, an interlayer insulation layer on the gate isolation layer and the second gate and a second source/drain on the interlayer insulation layer;

a first via is formed in the interlayer insulation layer and the gate isolation layer in the drive area and above the first polysilicon section corresponding thereto, and the first source/drain contacts with the first polysilicon section though the first via;

a second via is formed in the interlayer insulation layer and the gate isolation layer in the display area and above the second polysilicon section corresponding thereto, and the second source/drain contacts with the second polysilicon section though the second via;

in the display area, a heat sink section is provided under the second polysilicon section between the substrate and the buffer layer or between the buffer layer and the second polysilicon section.

A lattice dimension of the first polysilicon section is larger than a lattice dimension of the second polysilicon section; the substrate is a glass substrate; material of the buffer layer, the gate isolation layer and the interlayer insulation layer is Silicon Nitride, Silicon Oxide or a combination of the two; material of the first gate, the second gate, the first source/the first drain and the second source/the second drain is a stack combination of one or more of molybdenum, titanium, aluminum and copper; material of the heat sink section is metal or nonconducting metallic oxide.

The benefits of the present invention are: in the manufacture method of the Low Temperature Poly-silicon TFT substrate and the Low Temperature Poly-silicon TFT substrate according to the present invention, by locating one heat sink layer under the amorphous silicon layer in advance, the difference of the crystallizations of the polysilicons in the drive area and the display area can exist after implementing an Excimer Laser Annealing process to the amorphous silicon layer, and in the drive area, the polysilicon with the larger lattice dimension is formed to promote the electron mobility; the fractured crystals can be achieved in the crystallization process of the display area to form the polysilicon with the smaller lattice dimension for ensuring the uniformity of the grain boundary and raising the uniformity of the current, and thus, the electrical property demands for the different TFTs can be satisfied to raise the light uniformity of the OLED.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
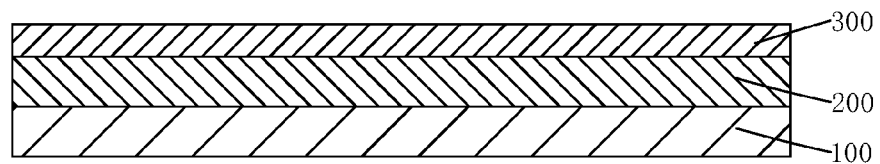
FIG. 1 is a diagram of the step 1 of a manufacture method of a Low Temperature Poly-silicon TFT substrate according to prior art.
Figure 2:
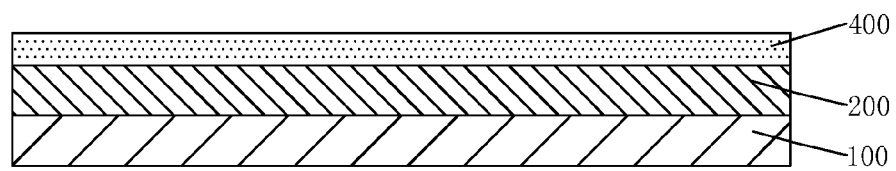
FIG. 2 is a diagram of the step 2 of a manufacture method of a Low Temperature Poly-silicon TFT substrate according to prior art.
Figure 3:
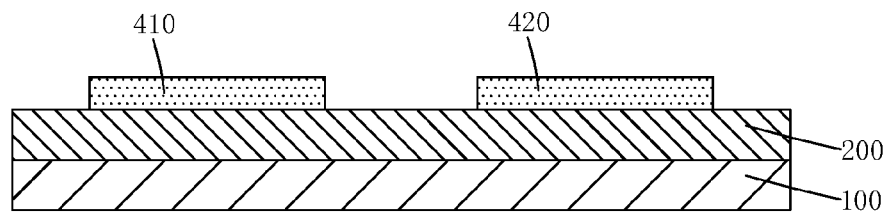
FIG. 3 is a diagram of the step 3 of a manufacture method of a Low Temperature Poly-silicon TFT substrate according to prior art.
Figure 4:
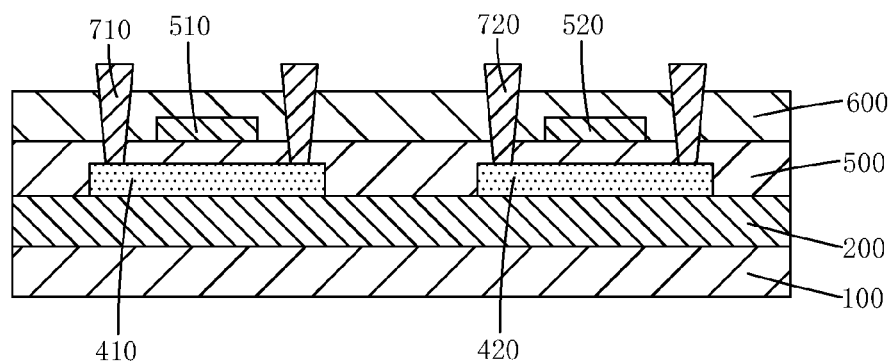
FIG. 4 is a diagram of the step 4 of a manufacture method of a Low Temperature Poly-silicon TFT substrate according to prior art.
Figure 5:
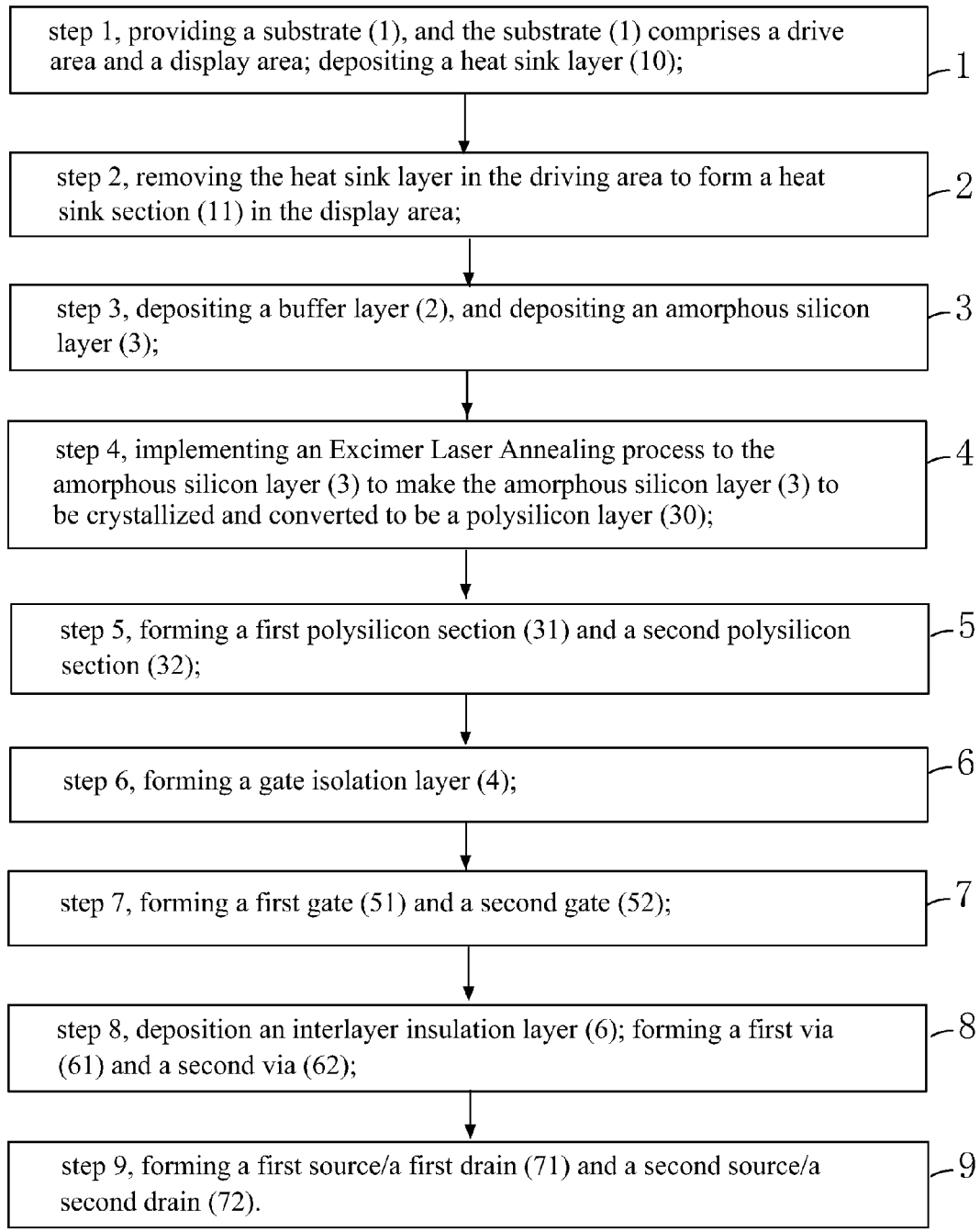
FIG. 5 is a flowchart of a manufacture method of a Low Temperature Poly-silicon TFT substrate according to the present invention.
Figure 6:
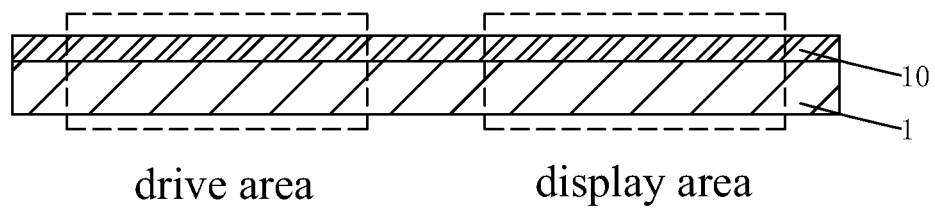
FIG. 6 is a diagram of the step 1 of a manufacture method of a Low Temperature Poly-silicon TFT substrate shown in FIG. 5.

Please refer to FIG. 5. The present invention first provides a manufacture method of a Low Temperature Poly-silicon TFT substrate, comprising steps of:

step 1, as shown in FIG. 6, providing a substrate 1, and the substrate 1 comprises a drive area and a display area, and depositing a heat sink layer 10 on the substrate 1.

Figure 7:
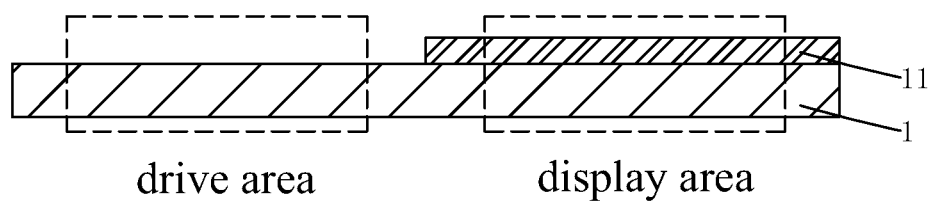
FIG. 7 is a diagram of the step 2 of a manufacture method of a Low Temperature Poly-silicon TFT substrate shown in FIG. 5.

Specifically, the substrate 1 is a glass substrate.

step 2, as shown in FIG. 7, patterning the heat sink layer 10 to remove the heat sink layer in the driving area to form a heat sink section 11 in the display area.

Figure 8:
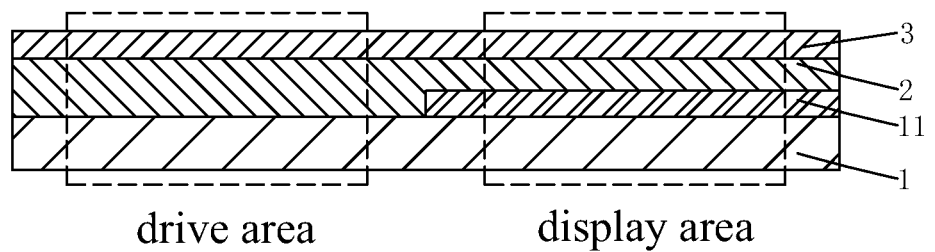
FIG. 8 is a diagram of the step 3 of a manufacture method of a Low Temperature Poly-silicon TFT substrate shown in FIG. 5.
Figure 9:
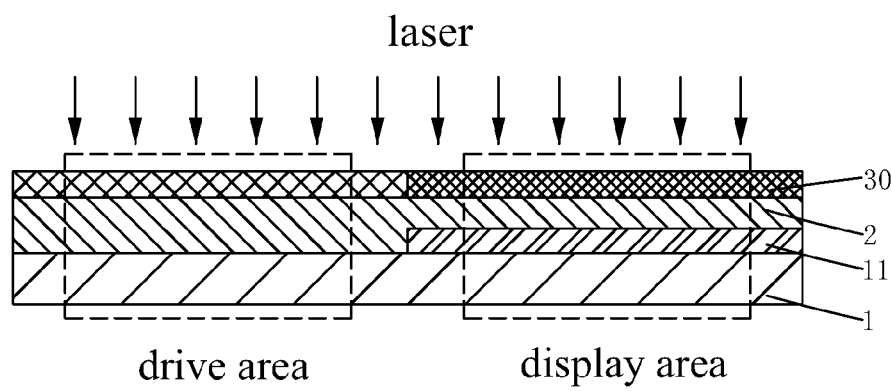
FIG. 9 is a diagram of the step 4 of a manufacture method of a Low Temperature Poly-silicon TFT substrate shown in FIG. 5.
Figure 10:
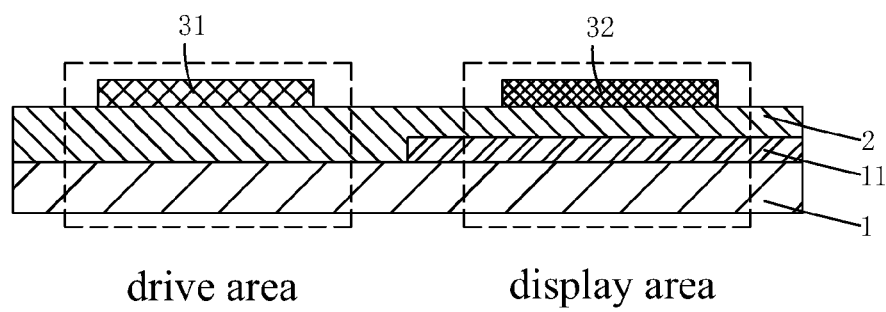
FIG. 10 is a diagram of the step 5 of a manufacture method of a Low Temperature Poly-silicon TFT substrate shown in FIG. 5.

Specifically, material of the heat sink section 11 is metal, such as molybdenum (Mo), titanium (Ti), aluminum (Al) and copper (Cu).

step 3, as shown in FIG. 8, depositing a buffer layer 2 on the substrate 1 and the heat sink section 11, and depositing an amorphous silicon layer 3 on the buffer layer 2.

step 4, as shown in FIG. 9, implementing an Excimer Laser Annealing process to the amorphous silicon layer 3 to make the amorphous silicon layer 3 to be crystallized and converted to be a polysilicon layer 30.

step 5, as shown in FIG. 10, patterning the polysilicon layer 30 to form a first polysilicon section 31 in the driving area, and a second polysilicon section 32 in the display area.

Figure 11:
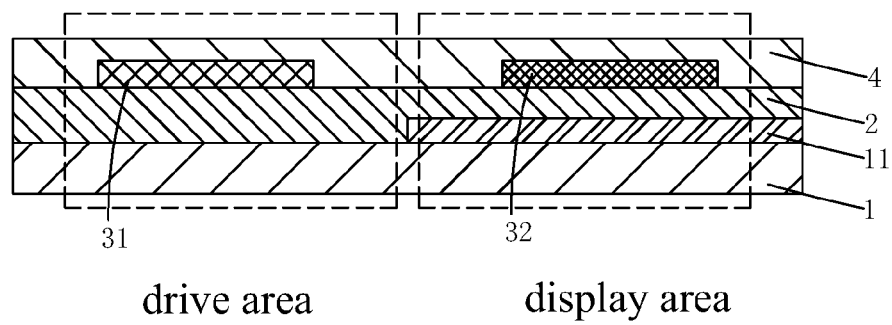
FIG. 11 is a diagram of the step 6 of a manufacture method of a Low Temperature Poly-silicon TFT substrate shown in FIG. 5.
Figure 12:
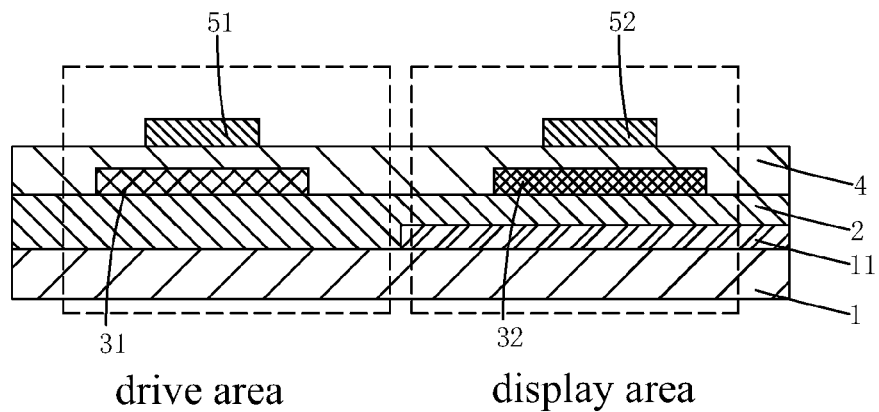
FIG. 12 is a diagram of the step 7 of a manufacture method of a Low Temperature Poly-silicon TFT substrate shown in FIG. 5.
Figure 13:
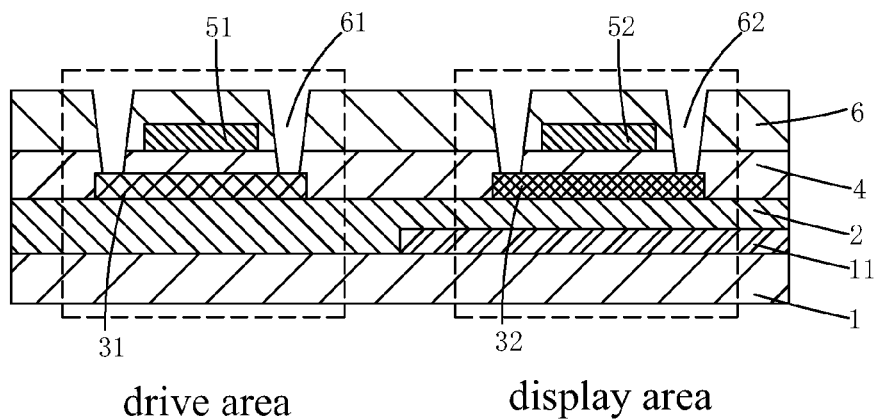
FIG. 13 is a diagram of the step 8 of a manufacture method of a Low Temperature Poly-silicon TFT substrate shown in FIG. 5.
Figure 14:
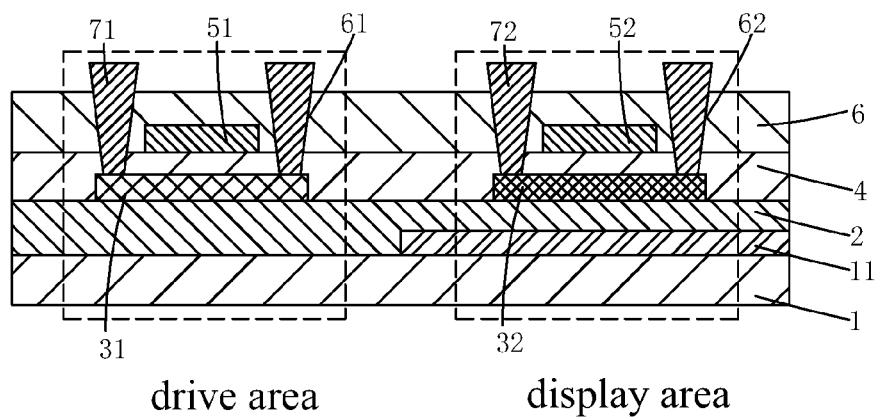
FIG. 14 is a diagram of the step 9 of a manufacture method of a Low Temperature Poly-silicon TFT substrate shown in FIG. 5, and also a sectional structure diagram of the first embodiment of a Low Temperature Poly-silicon TFT substrate according to the present invention.

Specifically, a lattice dimension of the first polysilicon section 31 is larger than a lattice dimension of the second polysilicon section 32. Because no heat sink layer is provided under the first polysilicon section 31, the polysilicon with the larger lattice dimension is formed in the driving area; the heat sink section 11 is provided under the second polysilicon section 32, and the heat sink is faster, and the insulating effect is poor. Therefore, the fractured crystals can be achieved in the crystallization process of the display area to form the polysilicon with the smaller lattice dimension for ensuring the uniformity of the grain boundary and raising the uniformity of the current.

step 6, as shown in FIG. 11, forming a gate isolation layer 4 on the buffer layer 2, the first polysilicon section 31 and the second polysilicon section 32.

step 7, as shown in FIG. 12, depositing a first metal layer on the gate isolation layer 4, and patterning the first metal layer to respectively form a first gate 51 and a second gate 52 on the first polysilicon section 31 and the second polysilicon section 32.

step 8, as shown in FIG. 13, deposition an interlayer insulation layer 6 on the gate isolation layer 4, the first gate 51 and the second gate 52; respectively forming a first via 61 and a second via 62 in the gate isolation layer 4 and the interlayer insulation layer 6 correspondingly above the first polysilicon section 31 and the second polysilicon section 32.

step 9, as shown in FIG. 14, depositing a second metal layer on the interlayer insulation layer 6, and patterning the second metal layer to respectively forming a first source/a first drain 71 in the driving area, and a second source/a second drain 72 in the display area.

The first source/the first drain 71 and the second source/the second drain 72 respectively contact with the first polysilicon section 31 and the second polysilicon section 32 through the first via 61 and the second via 62.

Specifically, material of the buffer layer 2, the gate isolation layer 4 and the interlayer insulation layer 6 is Silicon Nitride, Silicon Oxide or a combination of the two.

Specifically, material of the first gate 51, the second gate 52, the first source/the first drain 71 and the second source/the second drain 72 is a stack combination of one or more of molybdenum, titanium, aluminum and copper.

Figure 15:
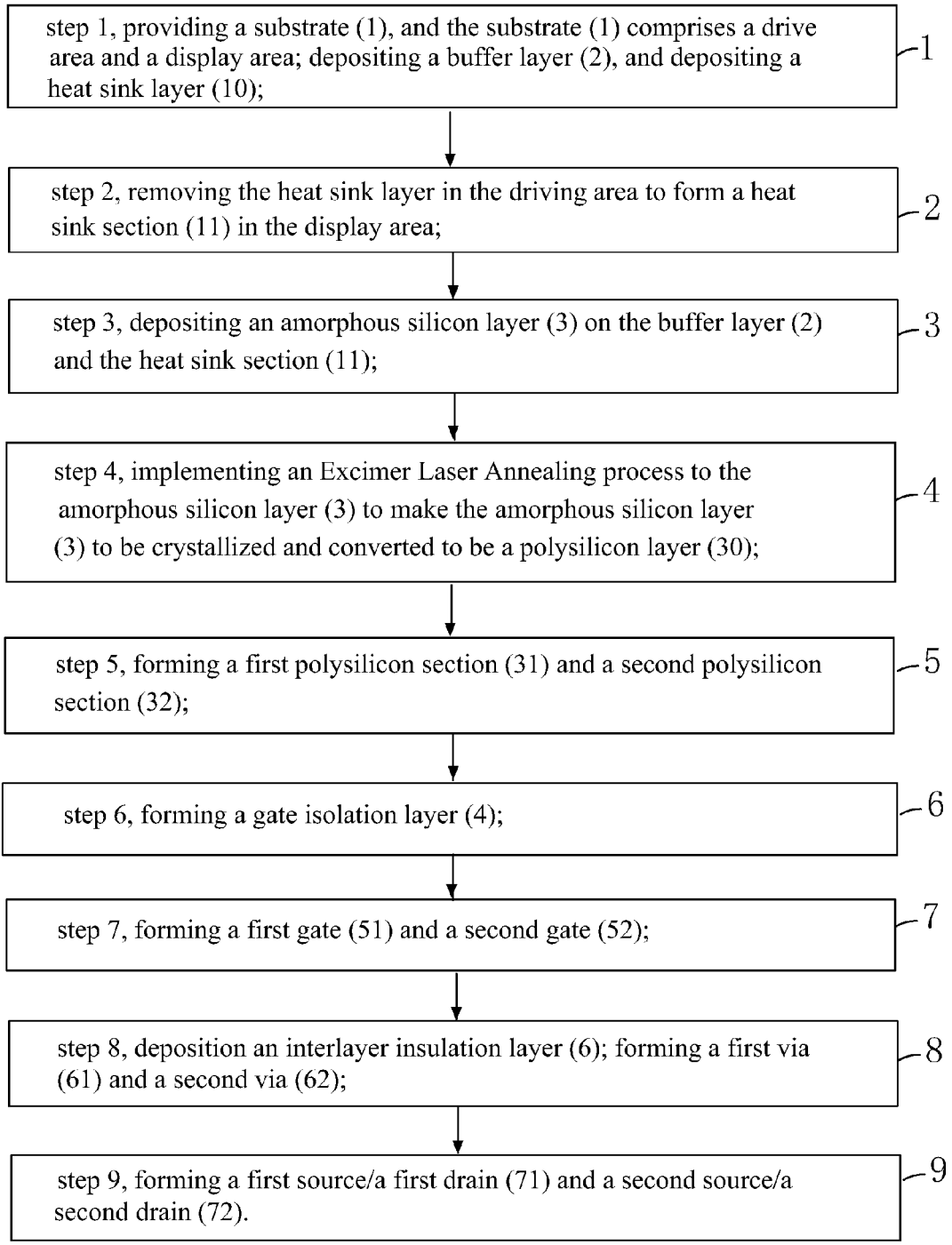
FIG. 15 is a flowchart of a manufacture method of another Low Temperature Poly-silicon TFT substrate according to the present invention.
Figure 16:
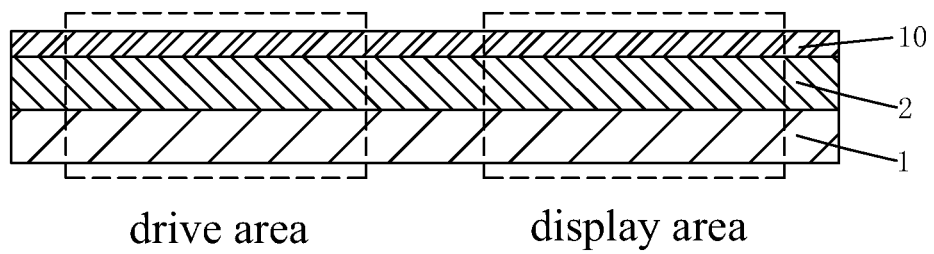
FIG. 16 is a diagram of the step 1 of a manufacture method of a Low Temperature Poly-silicon TFT substrate shown in FIG. 15.

Please refer to FIG. 15. The present invention further provides a manufacture method of a Low Temperature Poly-silicon TFT substrate, comprising steps of:

step 1, as shown in FIG. 6, providing a substrate 1, and the substrate 1 comprises a drive area and a display area, and depositing a buffer layer 2 on the substrate 1, and depositing a heat sink layer 10 on the buffer layer 2.

Figure 17:
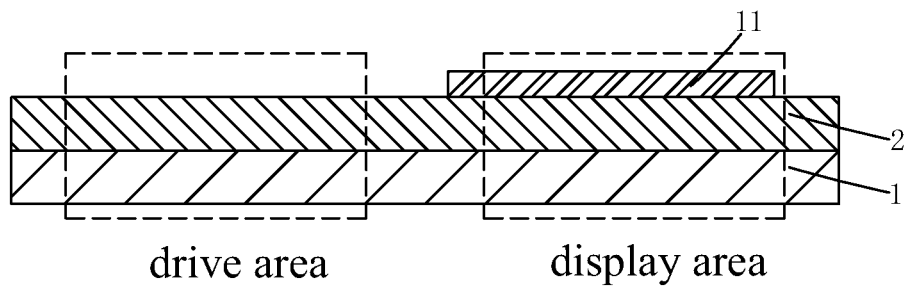
FIG. 17 is a diagram of the step 2 of a manufacture method of a Low Temperature Poly-silicon TFT substrate shown in FIG. 15.

Specifically, the substrate 1 is a glass substrate.

step 2, as shown in FIG. 17, patterning the heat sink layer 10 to remove the heat sink layer 10 in the driving area to form a heat sink section 11 in the display area.

Figure 18:
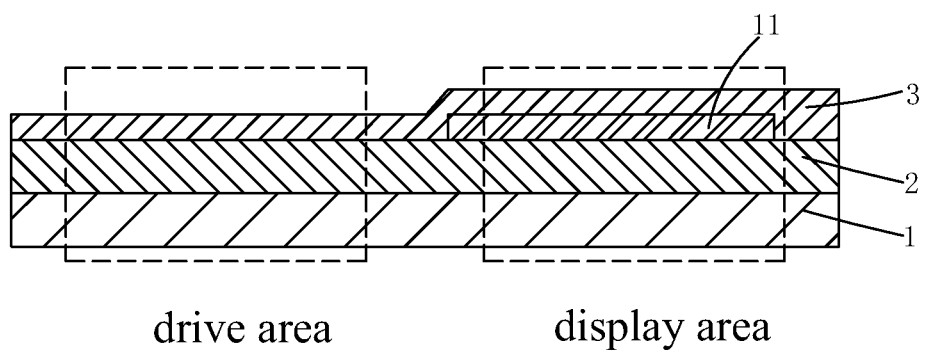
FIG. 18 is a diagram of the step 3 of a manufacture method of a Low Temperature Poly-silicon TFT substrate shown in FIG. 15.
Figure 19:
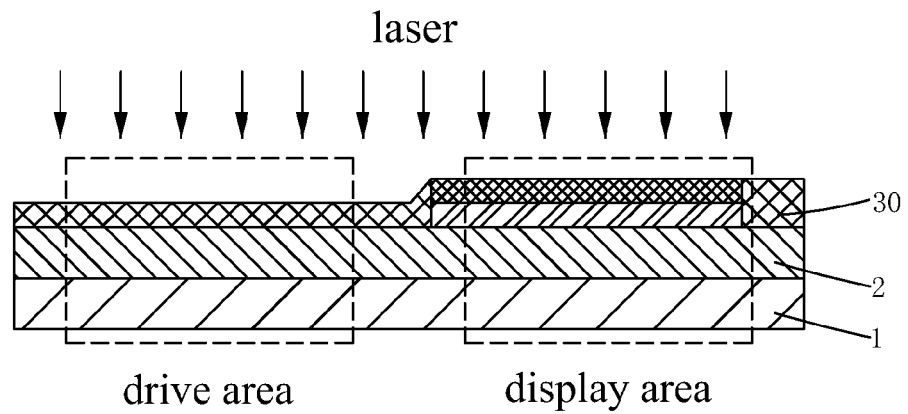
FIG. 19 is a diagram of the step 4 of a manufacture method of a Low Temperature Poly-silicon TFT substrate shown in FIG. 15.
Figure 20:
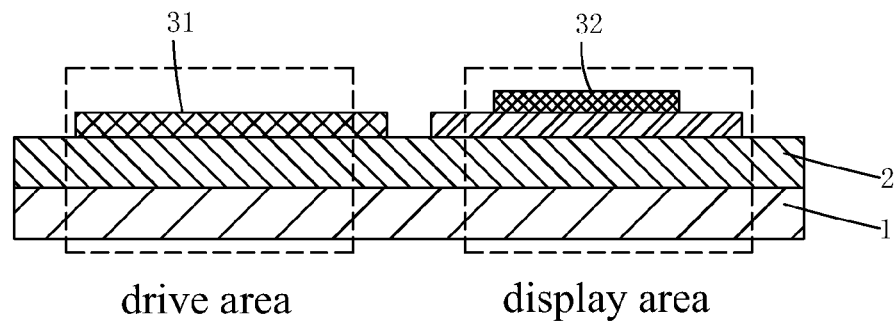
FIG. 20 is a diagram of the step 5 of a manufacture method of a Low Temperature Poly-silicon TFT substrate shown in FIG. 15.

Specifically, material of the heat sink section 11 is non-conducting metallic oxide, such as aluminum oxide.

step 3, as shown in FIG. 18, depositing an amorphous silicon layer 3 on the buffer layer 2 and the heat sink section 11.

step 4, as shown in FIG. 19, implementing an Excimer Laser Annealing process to the amorphous silicon layer 3 to make the amorphous silicon layer 3 to be crystallized and converted to be a polysilicon layer 30.

step 5, as shown in FIG. 20, patterning the polysilicon layer 30 to form a first polysilicon section 31 in the driving area, and a second polysilicon section 32 in the display area.

Figure 21:
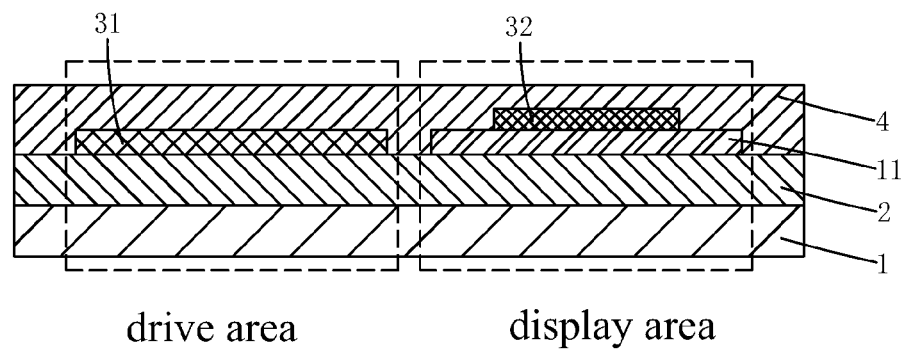
FIG. 21 is a diagram of the step 6 of a manufacture method of a Low Temperature Poly-silicon TFT substrate shown in FIG. 15.
Figure 22:
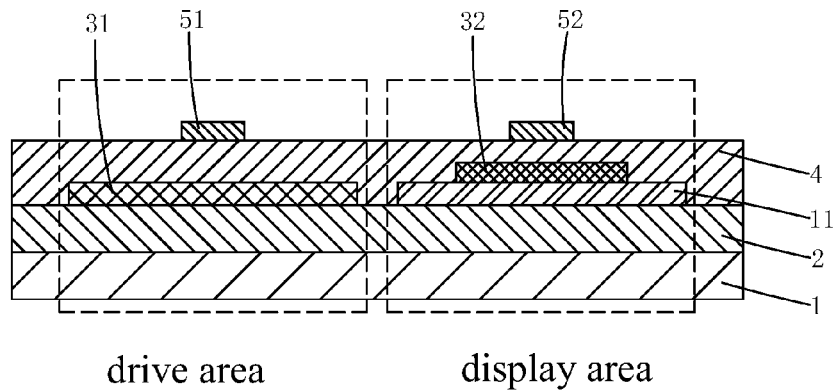
FIG. 22 is a diagram of the step 7 of a manufacture method of a Low Temperature Poly-silicon TFT substrate shown in FIG. 15.
Figure 23:
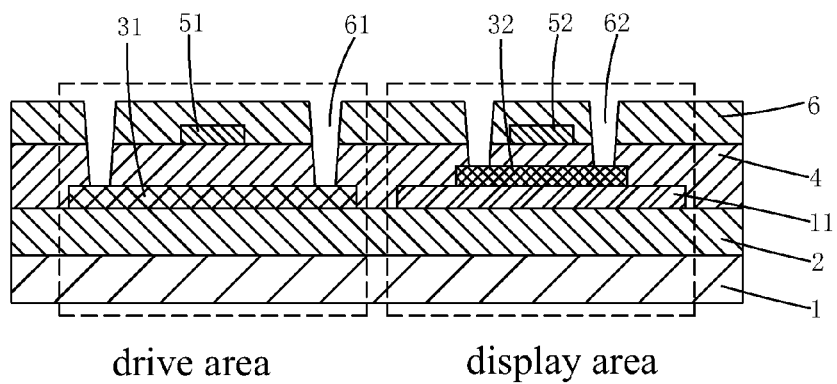
FIG. 23 is a diagram of the step 8 of a manufacture method of a Low Temperature Poly-silicon TFT substrate shown in FIG. 15.
Figure 24:
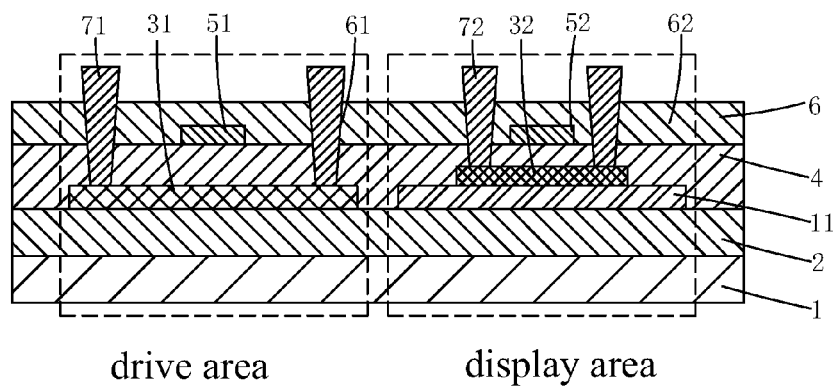
FIG. 24 is a diagram of the step 9 of a manufacture method of a Low Temperature Poly-silicon TFT substrate shown in FIG. 15, and also a sectional structure diagram of the second embodiment of a Low Temperature Poly-silicon TFT substrate according to the present invention.

Specifically, a lattice dimension of the first polysilicon section 31 is larger than a lattice dimension of the second polysilicon section 32. Because no heat sink layer is provided under the first polysilicon section 31, the insulating effect is better, and the polysilicon with the larger lattice dimension is formed in the driving area; the heat sink section 11 is provided under the second polysilicon section 32, and the heat sink is faster. Therefore, the fractured crystals can be achieved in the crystallization process of the display area to form the polysilicon with the smaller lattice dimension for ensuring the uniformity of the grain boundary and raising the uniformity of the current.

step 6, as shown in FIG. 21, forming a gate isolation layer 4 on the buffer layer 2, the first polysilicon section 31, the second polysilicon section 32 and the heat sink section 11.

step 7, as shown in FIG. 22, depositing a first metal layer on the gate isolation layer 4, and patterning the first metal layer to respectively form a first gate 51 and a second gate 52 on the first polysilicon section 31 and the second polysilicon section 32.

step 8, as shown in FIG. 23, deposition an interlayer insulation layer 6 on the gate isolation layer 4, the first gate 51 and the second gate 52; respectively forming a first via 61 and a second via 62 in the gate isolation layer 4 and the interlayer insulation layer 6 correspondingly above the first polysilicon section 31 and the second polysilicon section 32.

step 9, as shown in FIG. 24, depositing a second metal layer on the interlayer insulation layer 6, and patterning the second metal layer to respectively forming a first source/a first drain 71 in the driving area, and a second source/a second drain 72 in the display area.

The first source/the first drain 71 and the second source/the second drain 72 respectively contact with the first polysilicon section 31 and the second polysilicon section 32 through the first via 61 and the second via 62.

Specifically, material of the buffer layer 2, the gate isolation layer 4 and the interlayer insulation layer 6 is Silicon Nitride, Silicon Oxide or a combination of the two.

Specifically, material of the first gate 51, the second gate 52, the first source/the first drain 71 and the second source/the second drain 72 is a stack combination of one or more of molybdenum, titanium, aluminum and copper.

Please refer to FIG. 14 and FIG. 24. The present invention further provides a Low Temperature Poly-silicon TFT substrate structure, comprising a drive area and a display area, and the drive area comprises a substrate 1, a buffer layer 2 on the substrate 1, a first polysilicon section 31 on the buffer layer 2, a gate isolation layer 4 on the buffer layer 2 and the first polysilicon section 31, a first gate 51 on the gate isolation layer 4 and above the first polysilicon section 31 corresponding thereto, an interlayer insulation layer 6 on the gate isolation layer 4 and the first gate 51 and a first source/drain 71 on the interlayer insulation layer 6;

the display area comprises a substrate 1, a buffer layer 2 on the substrate 1, a second polysilicon section 32 on the buffer layer 2, a gate isolation layer 4 on the buffer layer 2 and the second polysilicon section 32, a second gate 52 on the gate isolation layer 4 and above the second polysilicon section 32 corresponding thereto, an interlayer insulation layer 6 on the gate isolation layer 4 and the second gate 52 and a second source/drain 72 on the interlayer insulation layer 6;

a first via 61 is formed in the interlayer insulation layer 6 and the gate isolation layer 4 in the drive area and above the first polysilicon section 31 corresponding thereto, and the first source/drain 71 contacts with the first polysilicon section 31 though the first via 61;

a second via 62 is formed in the interlayer insulation layer 6 and the gate isolation layer 4 in the display area and above the second polysilicon section 32 corresponding thereto, and the second source/drain 72 contacts with the second polysilicon section 32 though the second via 62;

in the display area, a heat sink section 11 is provided under the second polysilicon section 32 between the substrate 1 and the buffer layer 2 or between the buffer layer 2 and the second polysilicon section 32.

Please refer to FIG. 14, which is a sectional structure diagram of the first embodiment of a Low Temperature Poly-silicon TFT substrate according to the present invention. In the display area, a heat sink section 11 is provided under the second polysilicon section 32 between the substrate 1 and the buffer layer 2, and material of the heat sink section 11 is metal, such as molybdenum (Mo), titanium (Ti), aluminum (Al) and copper (Cu).

Please refer to FIG. 24, which is a sectional structure diagram of the second embodiment of a Low Temperature Poly-silicon TFT substrate according to the present invention. In the display area, a heat sink section 11 is provided under the second polysilicon section 32 between the buffer layer 2 and the second polysilicon section 32, and material of the heat sink section 11 is nonconducting metallic oxide, such as aluminum oxide.

Specifically, a lattice dimension of the first polysilicon section 31 is larger than a lattice dimension of the second polysilicon section 32.

Specifically, the substrate 1 is a glass substrate.

Specifically, material of the buffer layer 2, the gate isolation layer 4 and the interlayer insulation layer 6 is Silicon Nitride, Silicon Oxide or a combination of the two.

Specifically, material of the first gate 51, the second gate 52, the first source/the first drain 71 and the second source/the second drain 72 is a stack combination of one or more of molybdenum, titanium, aluminum and copper.

In conclusion, in the manufacture method of the Low Temperature Poly-silicon TFT substrate and the Low Temperature Poly-silicon TFT substrate according to the present invention, by locating one heat sink layer under the amorphous silicon layer in advance, the difference of the crystallizations of the polysilicons in the drive area and the display area can exist after implementing an Excimer Laser Annealing process to the amorphous silicon layer, and in the drive area, the polysilicon with the larger lattice dimension is formed to promote the electron mobility; the fractured crystals can be achieved in the crystallization process of the display area to form the polysilicon with the smaller lattice dimension for ensuring the uniformity of the grain boundary and raising the uniformity of the current, and thus, the electrical property demands for the different TFTs can be satisfied to raise the light uniformity of the OLED.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A manufacture method of a Low Temperature Poly-silicon TFT substrate, comprising steps of:
   step 1, providing a substrate, and the substrate comprises a drive area and a display area, and depositing a buffer layer on the substrate, and depositing a heat sink layer on the buffer layer, wherein material of the heat sink section is electrically nonconducting metallic oxide;
   step 2, patterning the heat sink layer to remove the heat sink layer in the drive area to form a heat sink section in the display area;
   step 3, depositing an amorphous silicon layer on the buffer layer and the heat sink section;
   step 4, implementing an Excimer Laser Annealing process to the amorphous silicon layer to make the amorphous silicon layer to be crystallized and converted to be a polysilicon layer;
   step 5, patterning the polysilicon layer to form a first polysilicon section in the drive area, and a second polysilicon section in the display area, wherein a lattice dimension of the first polysilicon section is larger than a lattice dimension of the second polysilicon section to promote an electron mobility of the first polysilicon section and to ensure an uniformity of a grain boundary and raise an uniformity of a current of the second polysilicon section;
   step 6, forming a gate isolation layer on the buffer layer, the first polysilicon section, the second polysilicon section and the heat sink section;
   step 7, depositing a first metal layer on the gate isolation layer, and patterning the first metal layer to respectively form a first gate and a second gate on the first polysilicon section and the second polysilicon section;
   step 8, deposition an interlayer insulation layer on the gate isolation layer, the first gate and the second gate; respectively forming a first via and a second via in the gate isolation layer and the interlayer insulation layer correspondingly above the first polysilicon section and the second polysilicon section;
   step 9, depositing a second metal layer on the interlayer insulation layer, and patterning the second metal layer to respectively forming a first source/a first drain in the drive area, and a second source/a second drain in the display area;
   the first source/the first drain and the second source/the second drain respectively contact with the first polysilicon section and the second polysilicon section through the first via and the second via.

2. The manufacture method of the Low Temperature Poly-silicon TFT substrate structure according to claim 1, wherein the substrate is a glass substrate; material of the buffer layer, the gate isolation layer and the interlayer insulation layer is Silicon Nitride, Silicon Oxide or a combination of the two; material of the first gate, the second gate, the first source/the first drain and the second source/the second drain is a stack combination of one or more of molybdenum, titanium, aluminum and copper.

3. A Low Temperature Poly-silicon TFT substrate structure, comprising a drive area and a display area, and the drive area comprises a substrate, a buffer layer on the substrate, a first polysilicon section on the buffer layer, a gate isolation layer on the buffer layer and the first polysilicon section, a first gate on the gate isolation layer and above the first polysilicon section corresponding thereto, an interlayer insulation layer on the gate isolation layer and the first gate and a first source/drain on the interlayer insulation layer;
   the display area comprises a substrate, a buffer layer on the substrate, a second polysilicon section on the buffer layer, a gate isolation layer on the buffer layer and the second polysilicon section, a second gate on the gate isolation layer and above the second polysilicon section corresponding thereto, an interlayer insulation layer on the gate isolation layer and the second gate and a second source/drain on the interlayer insulation layer;
   a first via is formed in the interlayer insulation layer and the gate isolation layer in the drive area and above the first polysilicon section corresponding thereto, and the first source/drain contacts with the first polysilicon section though the first via;
   a second via is formed in the interlayer insulation layer and the gate isolation layer in the display area and above the second polysilicon section corresponding thereto, and the second source/drain contacts with the second polysilicon section though the second via;
   in the display area, a heat sink section, of which material of the heat sink section is electrically nonconducting metallic oxide, is provided under the second polysilicon section between the substrate and the buffer layer or between the buffer layer and the second polysilicon section, wherein, a lattice dimension of the first polysilicon section is larger than a lattice dimension of the second polysilicon section to promote an electron mobility of the first polysilicon section and to ensure an uniformity of a grain boundary and raise an uniformity of a current of the second polysilicon section.

4. The Low Temperature Poly-silicon TFT substrate structure according to claim 3, wherein the substrate is a glass substrate; material of the buffer layer, the gate isolation layer and the interlayer insulation layer is Silicon Nitride, Silicon Oxide or a combination of the two; material of the first gate, the second gate, the first source/the first drain and the second source/the second drain is a stack combination of one or more of molybdenum, titanium, aluminum and copper.

* * * * *